US011209477B2

(12) United States Patent
Wang et al.

(10) Patent No.: US 11,209,477 B2
(45) Date of Patent: Dec. 28, 2021

(54) TESTING FIXTURE AND TESTING ASSEMBLY

(71) Applicant: NANYA TECHNOLOGY CORPORATION, New Taipei (TW)

(72) Inventors: Ching-Chung Wang, New Taipei (TW); Jui-Hsiu Jao, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 137 days.

(21) Appl. No.: 16/670,237

(22) Filed: Oct. 31, 2019

(65) Prior Publication Data

US 2021/0132139 A1 May 6, 2021

(51) Int. Cl.
*G01R 31/28* (2006.01)
*H05K 1/11* (2006.01)
*H05K 1/18* (2006.01)

(52) U.S. Cl.
CPC ......... *G01R 31/2808* (2013.01); *H05K 1/115* (2013.01); *H05K 1/181* (2013.01)

(58) Field of Classification Search
CPC ..... G01R 31/2808; H05K 1/115; H05K 1/181
USPC ........................ 324/750.13, 207.15
See application file for complete search history.

(56) References Cited

U.S. PATENT DOCUMENTS

| 5,907,246 | A | * | 5/1999 | Abraham | ............... G01R 1/04 324/750.08 |
| 6,091,253 | A | | 7/2000 | Huang | |
| 6,734,690 | B1 | * | 5/2004 | Ashby | ............... G01R 1/045 324/754.14 |
| 2012/0025860 | A1 | | 2/2012 | Sun et al. | |
| 2016/0061884 | A1 | * | 3/2016 | Cho | ............... G01R 31/2867 324/750.13 |

FOREIGN PATENT DOCUMENTS

| TW | 200907350 A | 2/2009 |
| TW | 201212391 A | 3/2012 |
| TW | M582137 U | 8/2019 |

* cited by examiner

*Primary Examiner* — Farhana A Hoque
(74) *Attorney, Agent, or Firm* — Muncy, Geissler, Olds and Lowe, P.C.

(57) ABSTRACT

The present disclosure provides a testing fixture for holding a device under test (DUT). The testing fixture includes a base, a frame, a recessed portion, a plurality of sets of electrical contacts and a plurality of electrical lines. The frame extends upward along an outer perimeter of an upper surface of the base. The recessed portion is surrounded by the frame and the upper surface of the base, and the DUT is received in the recessed portion. The plurality of sets of electrical contacts are disposed on the recessed portion and arranged in a rotationally symmetrical manner, wherein a plurality of plated through holes of the DUT are in contact with one set of the electrical contacts after the DUT is assembled with the testing fixture.

13 Claims, 9 Drawing Sheets

TESTING FIXTURE AND TESTING ASSEMBLY

TECHNICAL FIELD

The present disclosure relates to a carrier for holding a device under test (DUT) and an assembly including the carrier and the DUT, and more particularly, to a testing fixture for holding a printed circuit board (PCB) mounted with electronic components and an assembly including the testing fixture and the PCB.

DISCUSSION OF THE BACKGROUND

The assembly and population of a printed circuit board require many placement, soldering, and other process steps. Therefore, testing and inspection are vital to the economical fabrication of a high-quality product. This is especially true as chip circuit densities, I/O densities, and surface mount technologies drive up printed circuit board circuit loadings. Faults can have their origin in the component chips and bare boards, in component insertion, or in soldering. The faults themselves can be incorrect values or labels, poor circuit performance, open circuits, short circuits, components in incorrect position, physical damage, improper solder, damaged or open lands, or out of tolerance faults.

This Discussion of the Background section is provided for background information only. The statements in this Discussion of the Background are not an admission that the subject matter disclosed in this Discussion of the Background section constitute prior art to the present disclosure, and no part of this Discussion of the Background section may be used as an admission that any part of this application, including this Discussion of the Background section, constitutes prior art to the present disclosure.

SUMMARY

One aspect of the present disclosure provides testing fixture. The testing fixture includes a base, a frame and a plurality of sets of electrical contacts. The frame extends upward along an outer perimeter of an upper surface of the base. The plurality of sets of electrical contacts are disposed on the base and arranged in a rotationally symmetrical manner.

In some embodiments, the frame is symmetric in respect to a central axis of the base.

In some embodiments, the testing fixture further includes a plurality of connectors and a plurality of electrical lines; the plurality of connectors are disposed at a lateral of the base, and the plurality of electrical lines electrically connect the plurality of sets of the electrical contacts to the plurality of connectors.

In some embodiments, a number of the plurality of connectors is equal to a number of the plurality of sets of electrical contacts, and the plurality of connectors are arranged along a central axis of the base with consistent angular orientation.

In some embodiments, at least one electrical line is electrically connected to at least one set of the electrical contacts and to at least one connector.

In some embodiments, the electrical lines are buried in the base.

In some embodiments, the plurality of connectors are aligned with the plurality of sets of electrical contacts when viewed in a plan view.

In some embodiments, the plurality of connectors are offset from the plurality of sets of electrical contacts when viewed in a plan view.

Another aspect of the present disclosure provides a testing assembly. The testing assembly includes a device under test (DUT) and a testing fixture. The DUT includes a printed circuit board (PCB), at least one electronic component mounted on the PCB, and a plurality of plated through holes penetrating through the PCB. The testing fixture includes a base, a frame, a recessed portion and a plurality of sets of electrical contacts. The frame extends upward along an outer perimeter of an upper surface of the base. The recessed portion is surrounded by the frame and the upper surface of the base. The plurality of sets of electrical contacts are disposed on the base and arranged in a rotationally symmetrical manner, wherein the plurality of sets of electrical contacts are provided at positions corresponding to the plated through holes. The DUT is received in the recessed portion and the plurality of plated through holes are in contact with one set of the electrical contacts.

In some embodiments, the testing fixture further includes at least one fixed block disposed in the recessed portion for securing the DUT in the recessed portion.

In some embodiments, the testing fixture further includes at least one fastening member locking the fixed block to the base.

In some embodiments, the testing fixture further includes at least one fastening member locking the PCB to the base.

In some embodiments, a top surface of the PCB is coplanar with a top surface of the frame.

In some embodiments, the frame is symmetric in respect to a central axis of the base.

In some embodiments, the testing fixture further includes a plurality of connectors and a plurality of electrical lines; the plurality of connectors are disposed at a lateral of the base, and the plurality of electrical lines electrically connect the plurality of sets of electrical contacts to the plurality of connectors.

In some embodiments, the electrical lines are buried in the base.

In some embodiments, a number of the plurality of connectors is equal to a number of the plurality of sets of electrical contacts, and the plurality of connectors are arranged along a central axis of the base with consistent angular orientation.

With the above-mentioned configurations of the testing fixture including the plurality of sets of electrical contacts arranged in a rotationally symmetrical manner, the DUT can be mounted on the testing fixture in various orientations, which improves the assembly degree of freedom.

With the above-mentioned configurations of the testing fixture including the plurality of connectors arranged along the central axis of the base with consistent angular orientation, a power supply can connect to the testing fixture in various orientations, which improves the assembly degree of freedom.

The foregoing has outlined rather broadly the features and technical advantages of the present disclosure in order that the detailed description of the disclosure that follows may be better understood. Additional features and technical advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended claims.

BRIEF DESCRIPTION OF THE DRAWINGS

A more complete understanding of the present disclosure may be derived by referring to the detailed description and claims. The disclosure should also be understood to be coupled to the figures' reference numbers, which refer to similar elements throughout the description.

DETAILED DESCRIPTION

Figure 1:
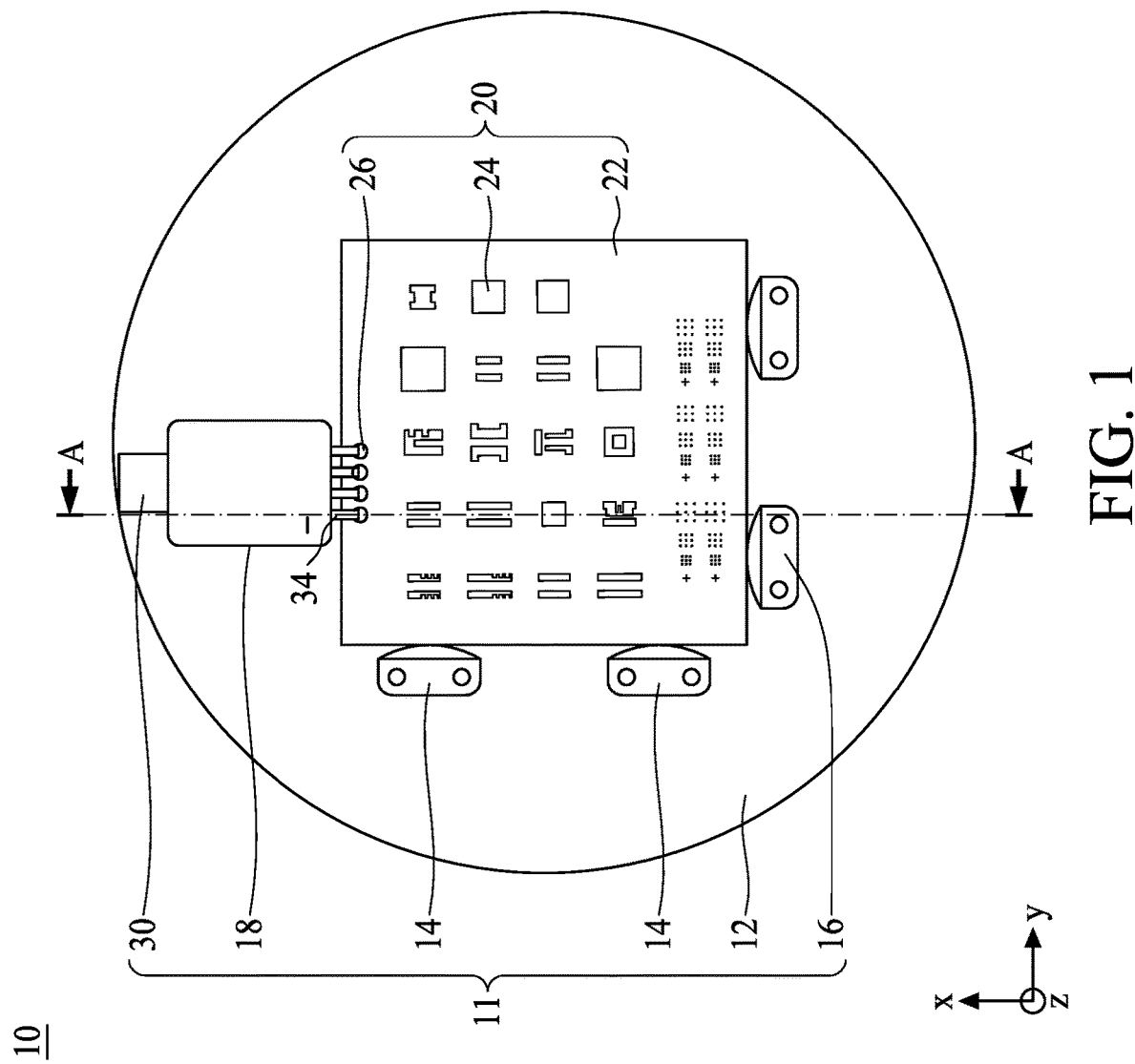
FIG. 1 is a top view of a comparative testing assembly.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another element, component, region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limiting to the present inventive concept. As used herein, the singular forms "a," "an" and "the" are intended to include the plural forms as well, unless the context clearly indicates otherwise. It shall be understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

Figure 2:
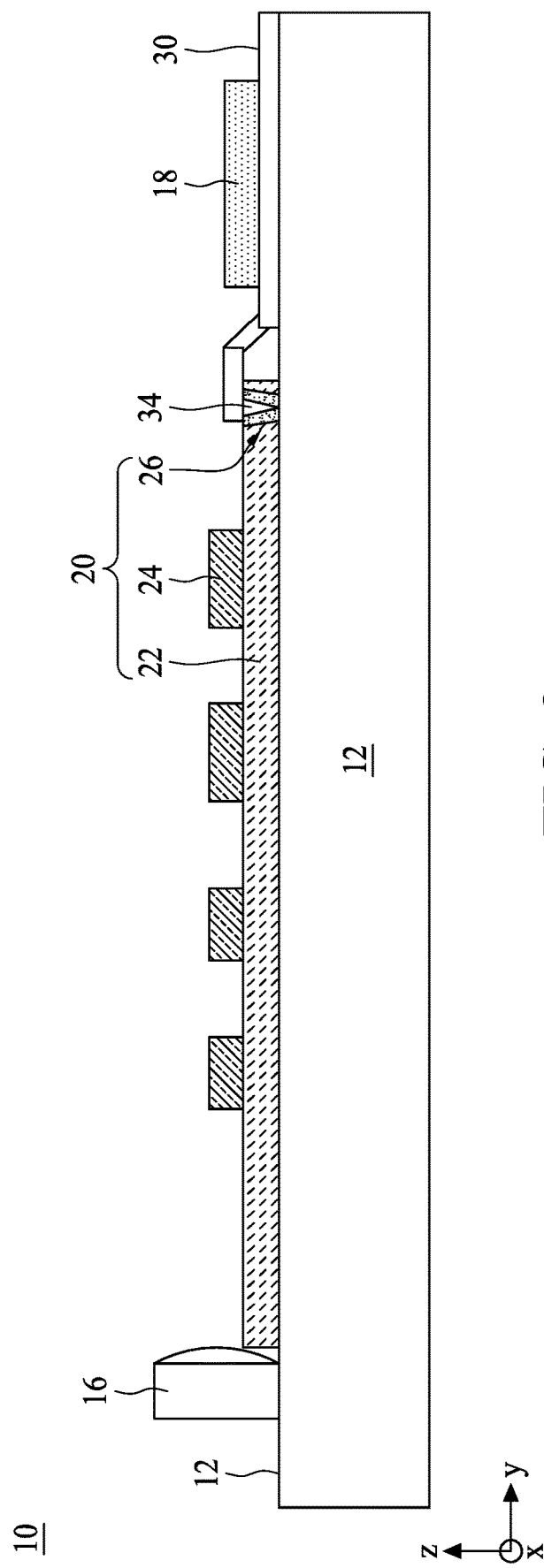
FIG. 2 is a cross-sectional view taken along the line A-A illustrated in FIG. 1.

FIG. 1 is a top view of a comparative testing assembly 10, and FIG. 2 is a cross-sectional view taken along the line A-A illustrated in FIG. 1. Referring to FIGS. 1 and 2, the testing assembly 10 includes a testing fixture 11 and a device under test (DUT) 20, and the testing fixture 11 is used to carry a device under test (DUT) 20, such as a printed circuit board (PCB) 22 mounted with multiple electronic components 24. The DUT 20 further includes a plurality of plated through holes 26 drilled completely through the PCB 22, metallized and electrically coupled to electronic components 24 through electrical traces (not shown) placed on or buried in the PCB 22.

The testing fixture 11 includes a platform 12, a plurality of first stoppers 14 disposed on the platform 12 and equidistantly arranged in a first direction x, a plurality of second stoppers 16 disposed on the platform 12 and equidistantly arranged in a second direction y, and a weight block 18 used to press a cable 30 of a testing probe or a power supply (not shown) to prevent the cable 30 from being displaced during operation, so as to decrease operation errors. The first stoppers 14 are used to block an edge of the DUT 20 and constrain a movement of the DUT 20 in the second direction y, and the second stoppers 16 are used to block another edge of the DUT 20 and constrain a movement of the DUT 20 in the first direction x perpendicular to the second direction y. A head 34 of the testing probe or the power supply contacts the plated through holes 26 to ensure that the DUT 20 works properly or to power the electronic components 24 to be tested.

In general, the plated through holes 26 are provided at one side of the PCB 22 to increase a footprint for mounting the electronic components 24. As a result, an edge of the PCB 22 formed with the plated through holes 26 needs to be oriented away from the first stoppers 14 and the second stoppers 16 for arranging the cable 30 and installing the head 34 conveniently. However, such requirement makes assembling the DUT 20 with the testing fixture 11 inefficient and inconvenient.

In addition, the head 34 can easily separate from the plated through holes 26 since the weight block 18 provides only a downward force on the cable 30 to secure the cable 30 to the platform 12. This results in reduced structural stability and structural reliability of the test assembly 10 during operation and transportation. In addition, the head 34 is easily damaged since top surfaces of the PCB 20 and the platform 12 are not at the same horizontal level.

Figure 3:
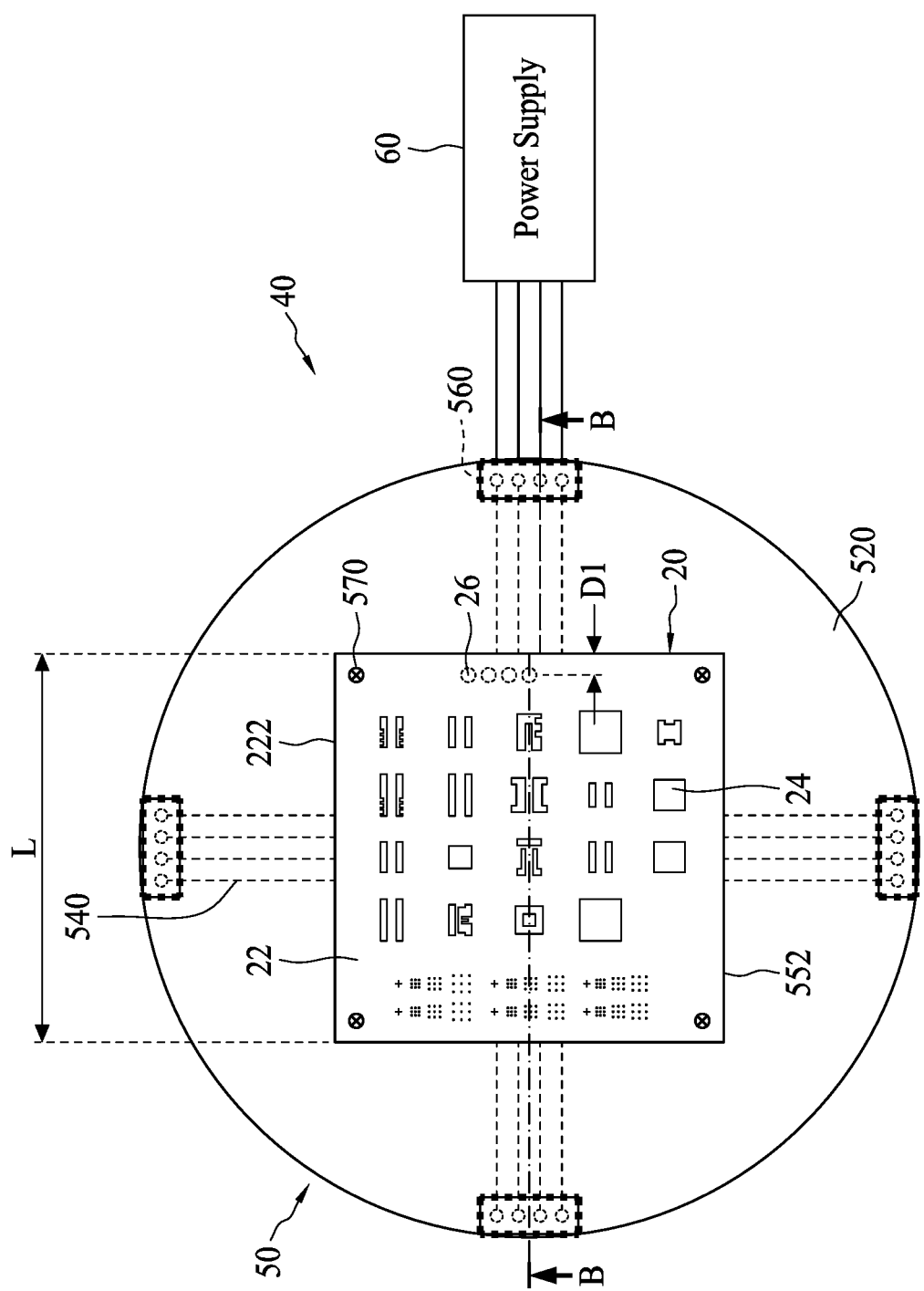
FIG. 3 is a top view of a testing assembly in accordance with some embodiments of the present disclosure.
Figure 4:
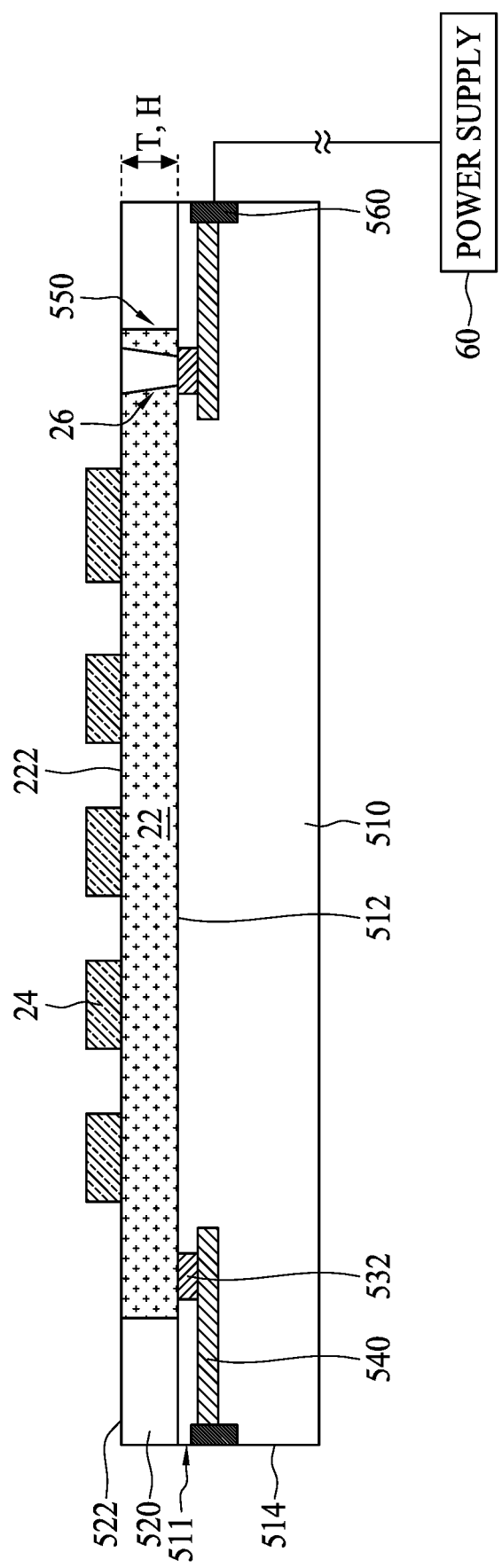
FIG. 4 is a cross-sectional view taken along the line B-B illustrated in FIG. 3.
Figure 5:
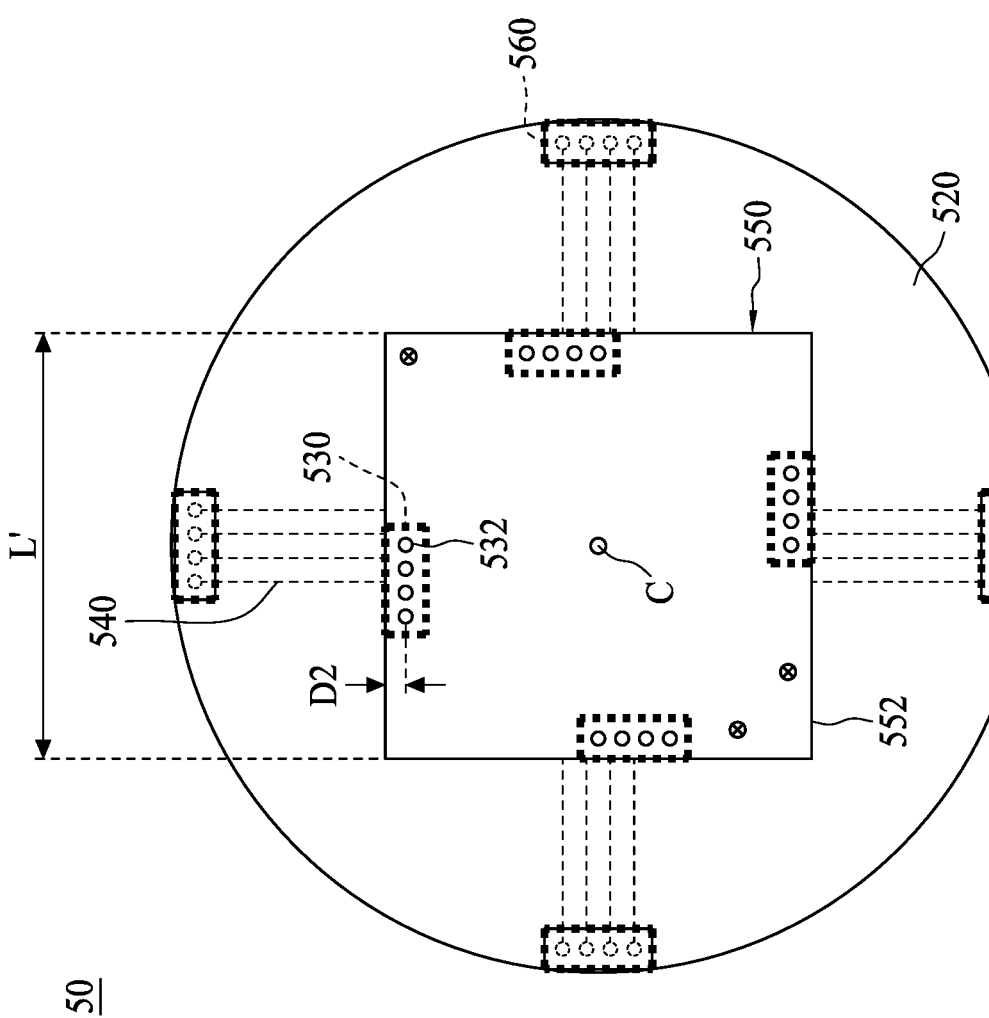
FIG. 5 is a top view of a testing fixture in accordance with some embodiments of the present disclosure.

FIG. 3 is a schematic view of a testing assembly 40 in accordance with some embodiments of the present disclosure, FIG. 4 is a cross-sectional view taken along the line B-B illustrated in FIG. 3, and FIG. 5 is a top view of a testing fixture in accordance with some embodiments of the present disclosure. Referring to FIGS. 3 to 5, the testing assembly 40 includes a testing fixture 50 and a DUT 20, wherein the testing fixture 50 is used to hold the DUT 20.

Referring to FIGS. 3 and 4, the DUT 20 includes a PCB 22 mounted with multiple electrical components 24 and a plurality of plated through holes 26 drilled completely through the PCB 22, metallized and electrically coupled to electronic components 24 through electrical traces (not shown). The PCB 22 has a perimeter 222. The perimeter 222 forms a square having a side length L in some embodiments. The side length L may be about 12 cm.

Referring to FIGS. 4 and 5, the testing fixture 50 includes a base 510, a frame 520 extending upward along an outer perimeter 511 of an upper surface 512 of the base 510, a plurality of sets of electrical contacts 530 disposed on the base 510 and arranged in a rotationally symmetrical manner, and a plurality of electrical lines 540 buried in the base 510 and electrically connecting the plurality of sets of electrical contacts 530 to a power supply 60. In some embodiments, the frame 520 is symmetric in respect to a central axis C of the base 510 and has a substantially planar upper surface 522. In some embodiments, at least one set of the electrical contacts 530 includes a plurality of electrical contacts 532 provided at positions corresponding to the plated through holes 26 formed through the PCB 22. In some embodiments, the electrical lines 540 connected to each set of the electrical contacts 530 are electrically isolated from one other. In some embodiments, a number of the electrical lines 540 connected to one set of the electrical contacts 530 is equal to a number of electrical contacts 532 in one set of the electrical contacts 530.

The testing fixture 50 further includes a recessed portion 550 surrounded by the frame 520 and the upper surface 512 of the base 510 for receiving the DUT 20. In some embodiments, the sets of the electrical contacts 530 are disposed in the recessed portion 550 and connected to the upper surface 512. In some embodiments, the frame 520 has a height H adapted to a thickness T of the PCB 22; as a result, when the DUT 20 is disposed in the recessed portion 550, a top surface 222 of the PCB 22 is coplanar with the upper surface 522 of the frame 520. Therefore, a head of a testing probe, contacting the plated through holes 26 to determine whether the DUT 20 functions properly, is not easily damaged. The base 510 and the frame 520 are made of insulating material, such as polytetrafluoroethylene (PTTE) in some embodiments.

Referring to FIG. 5, the base 510 has a circular shape, and the recessed portion 550 surrounded by the frame 520 and the base 510 has a square perimeter 552 when viewed in a plan view. In some embodiments, the base 510 may be a 12-inch diameter base, and the perimeter 552 of the recessed portion 550 has a side length L' not less than the length L of the PCB 22 shown in FIG. 3. In some embodiments, the length L' is about 12 cm. In alternative embodiments, the recessed portion 550 may have a regular polygonal perimeter when viewed in a plan view.

Referring to FIGS. 3 and 5, a distance D2 between the perimeter 552 of the recessed portion 550 and centers of the electrical contacts 530 is equal to a distance D1 between centers of the plated through holes 26 and an edge of the PCB 22 provided with the plated through holes 26. In some embodiments, a number of the sets of the electrical contacts 530 is equal to a number of sides of the recessed portion 550. For example, when the recessed portion 550 having the square perimeter 522 includes four sides, the testing fixture 50 includes four sets of the electrical contacts 530. Therefore, the plated through holes 26 formed through the PCB 22 can be disposed in the recessed portion 550 in different directions, improving the assembly degree of freedom.

Referring to FIGS. 4 and 5, the testing fixture 50 further includes a plurality of connectors 560 disposed in the base 510 and at a lateral 514 of the base 510. The connectors 560 are electrically connected to the electrical contacts 532 through the electrical lines 540. In some embodiments, a number of the connectors 560 is equal to the number of the sets of the electrical contacts 530. In some embodiments, the connectors 560 are offset from the plurality of sets of electrical contacts 530 when viewed in a plan view. The connectors 560 are adapted to be electrically connected to the power supply 60. More particularly, when the DUT 20 is received in the recessed portion 550, and the plated through holes 26 of the PCB 22 are aligned and in contact with one set of the electrical contacts 530, the power supply 60 can connect to one of the connectors 560 electrically coupled to the electrical contacts 532 aligned with the plated through holes 26, so that electricity supplied from the power supply 60 can be conducted to the DUT 20 for activating the electrical components 24. In some embodiments, the connectors 560 are arranged along a central axis of the base 510 with consistent angular orientation, such that the power supply 60 can be connected to the base 510 in different directions, improving the connection degree of freedom.

Referring again to FIG. 3, in some embodiments, the testing fixture 50 further includes one or more fastening members 570 used to position the DUT 20 on the base 510 so as to effectively prevent the DUT 20 from separating from the testing fixture 50 during operation. In some embodiments, the fastening members 570, such as screws, may be disposed at corners of the recessed portions 550.

Figure 6:
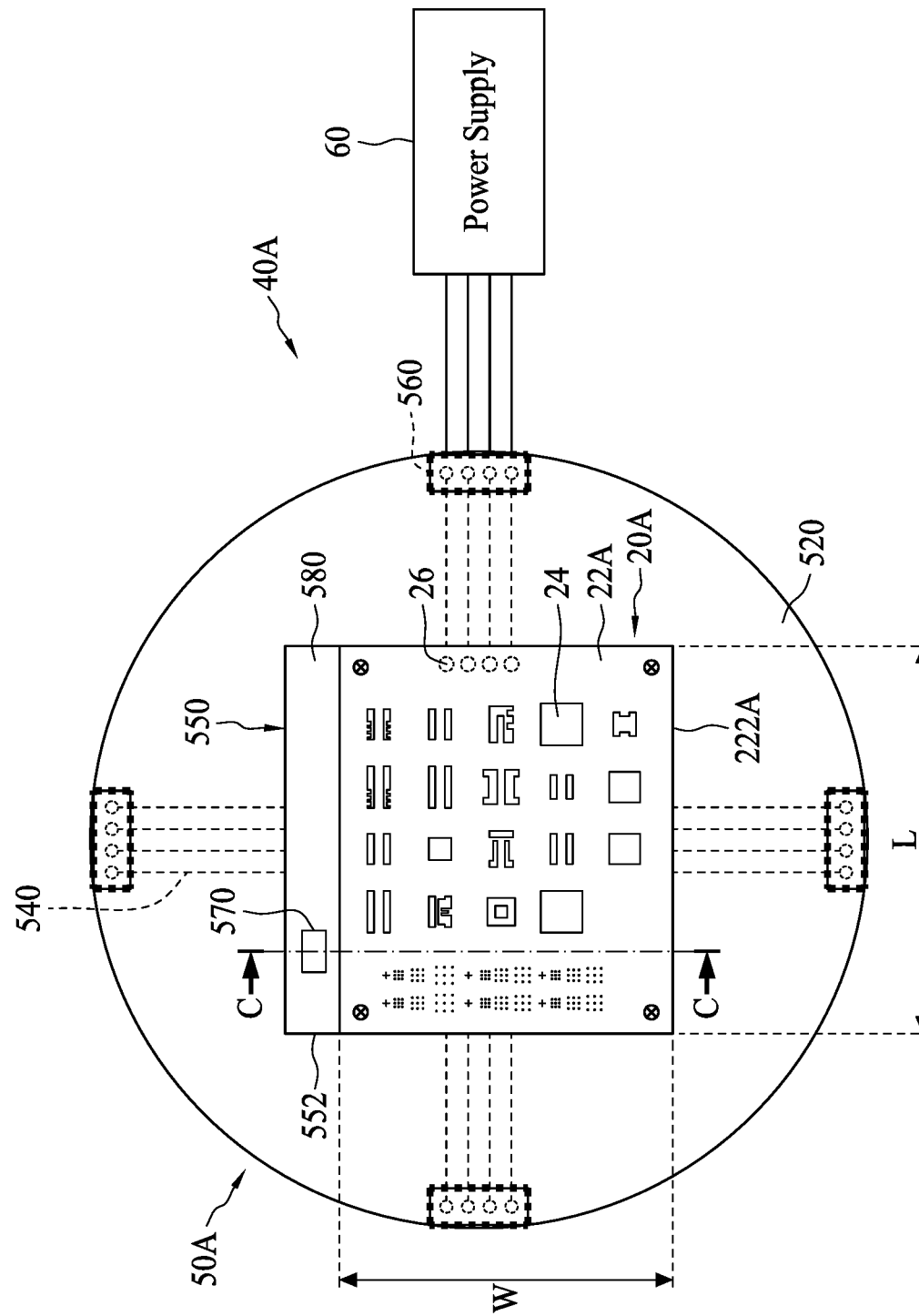
FIG. 6 is a top view of a testing assembly in accordance with some embodiments of the present disclosure.
Figure 7:
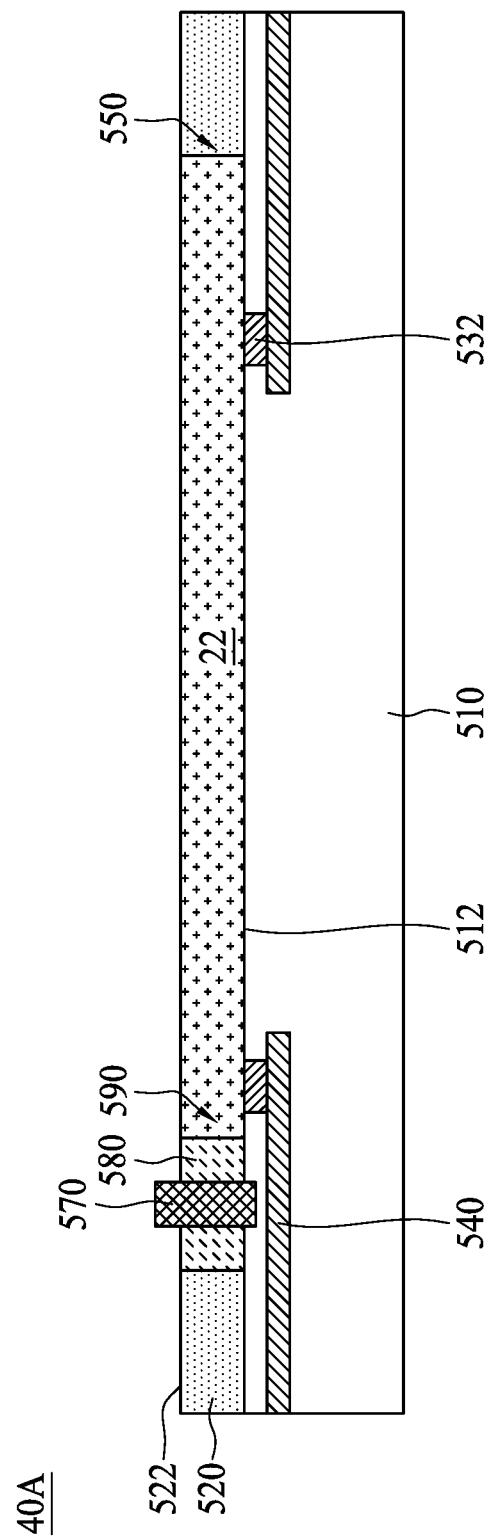
FIG. 7 is a cross-sectional view taken along the line C-C illustrated in FIG. 6.

FIG. 6 is a top view of a testing assembly 40A in accordance with some embodiments of the present disclosure, and FIG. 7 is a cross-sectional view taken along the line C-C illustrated in FIG. 6. Referring to FIGS. 6 and 7, the testing assembly 40A includes a testing fixture 50A and a DUT 20A, wherein the testing fixture 50A is used to carry and secure the DUT 20A. The DUT 20A includes a PCB 22A mounted with multiple electrical components 24 and a plurality of plated through holes 26 drilled completely through the PCB 22A, metallized and electrically coupled to the electrical components 24 through electrical traces (not shown). The PCB 22A has a perimeter 222A. In some embodiments, the perimeter 222A forms a rectangle having a width \V and a length L greater than the width W. In some embodiments, the width \V is about 10.5 cm, and the length L is about 12 cm. In some embodiments, the plated through holes 26 are provided at one shorter side of the PCB 22A.

The testing fixture 50A includes a base 510, a frame 520 extending upward along an outer perimeter of an upper surface 512 of the base 510, a plurality of sets of electrical contacts 530 disposed on the base 510 and arranged in a rotationally symmetrical manner and including a plurality of electrical contacts 532, a plurality of electrical lines 540 buried in the base 510 and electrically connecting the plurality of sets of electrical contacts 530 to a plurality of connectors 560, and one or more fixed blocks 580 for retaining the DUT 20A in a recessed portion 550 surrounded by the upper surface 512 of the base 510 and the frame 520.

The configurations of the base 510, the frame 520, the plurality of electrical lines 540, and the recessed portion 550 in these embodiments are essentially the same as the configurations of the like components, which are denoted by like reference numerals in the embodiments shown in FIGS. 3 to 5. The details of the like components shown in FIGS. 6 and 7 may thus be found in the discussion of the embodiments shown in FIGS. 3 to 5. However, the plurality of connectors 560 are aligned with the plurality of sets of electrical contacts 530 when viewed in a plan view.

The fixed blocks 580, for retaining the DUT 20A, are disposed in the recessed portion 550 when a size of the DUT 20A is too small to be suitably secured to the recessed portion 550. Specifically, when the DUT 20A with smaller size is received in the recessed portion 550 and the plated through holes 26 of the PCB 22A are aligned with one set of the electrical contacts 530, a passage section 590, in the recessed portion 550, is defined. The one or more fixed blocks 580 are disposed in the passage section 590 to press against one or more edges of the DUT 20A, so as to prevent the plated through holes 26 and the electrical contacts 532 from being displaced due to the influence of collision or transportation.

In some embodiments, the fixed blocks 580 may be rigid blocks; in such embodiments, the fixed blocks 580 and one or more fastening members 570, such as screws, can collectively position the DUT 20A in the recessed portion 550. Specifically, after the plated through holes 26 of the PCB 22A are aligned and in contact with the electrical contacts 532, the fixed block 580 buckles one or more edges of the PCB 22A to constrain a movement of the DUT 20A, and the fastening members 570 lock the fixed block 580 to the base 510. Thereby, the fixed blocks 580 and the base 510 can be firmly connected, and the overall structure of the testing assembly 40A can be strengthened. In order to prevent short circuit, the fastening members 570 in the base 510 cannot connect to the electrical contacts or the electrical lines 540. In some embodiments, the frame 520 and the fixed blocks 580 have the same height H.

In alternative embodiments, the fixed blocks 580 may be made of elastic material to retract under stress upon the passage section 590 during the engagement of the DUT 22A in the recessed portion 550; in such embodiments, the fastening member 570 can be omitted.

Figure 8:
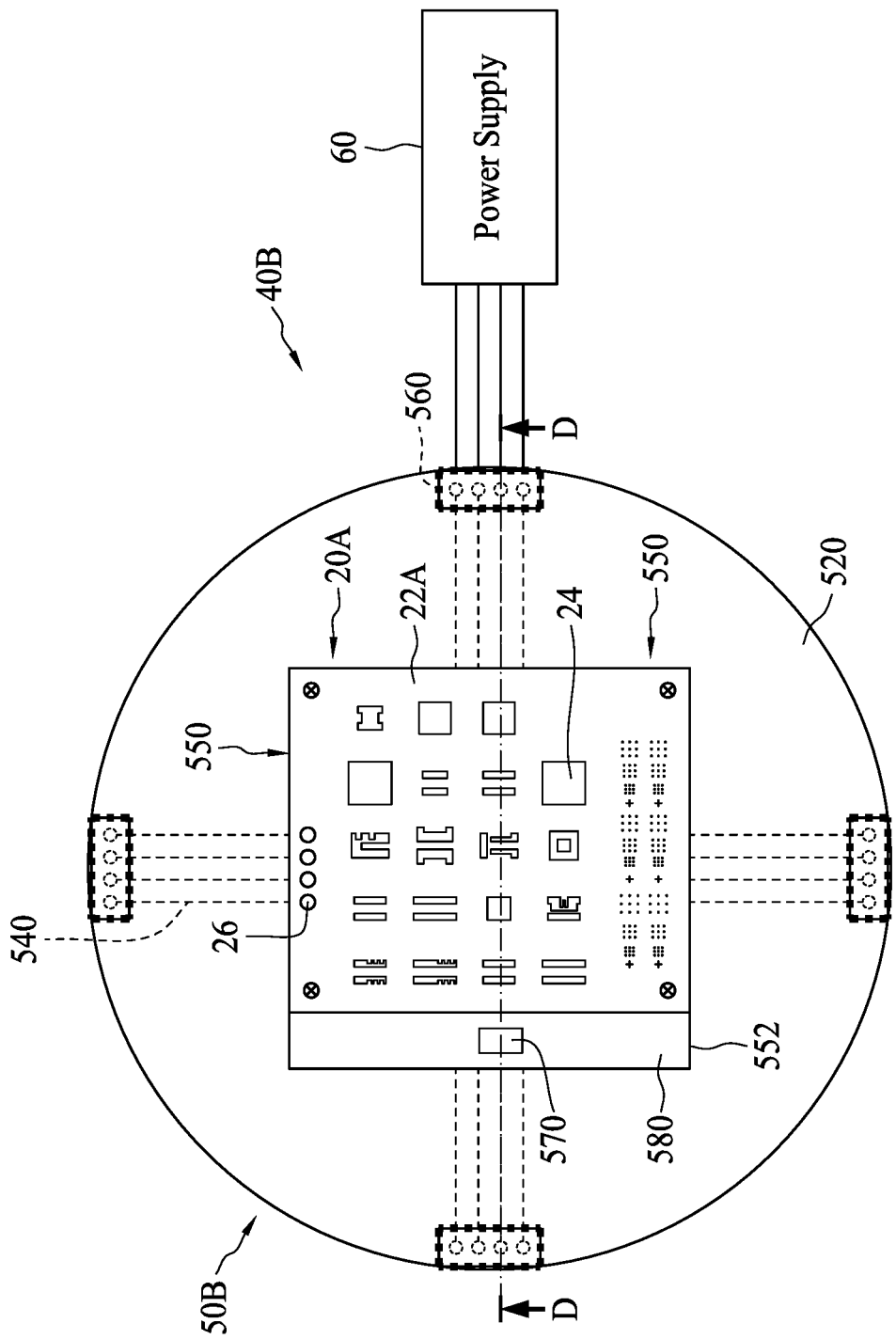
FIG. 8 is a top view of a testing assembly in accordance with some embodiments of the present disclosure.
Figure 9:
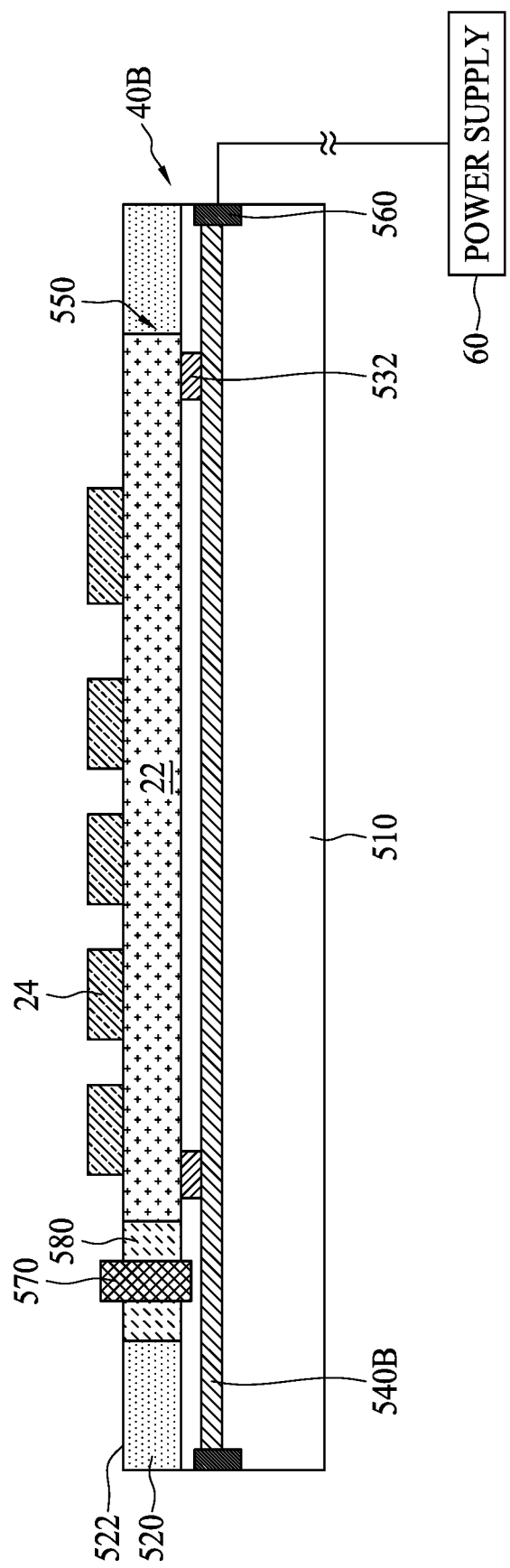
FIG. 9 is a cross-sectional view taken along the line D-D illustrated in FIG. 8.

FIG. 8 is a top view of a testing assembly 40B in accordance with some embodiments of the present disclosure, and FIG. 9 is a cross-sectional view taken along the line D-D illustrated in FIG. 8. Referring to FIGS. 8 and 9, the testing assembly 40B includes a testing fixture 50B and a DUT 20A disposed on the testing fixture 50B. The testing fixture 50B includes a base 510, a frame 520 extending upward along an outer perimeter of an upper surface 512 of the base 510, a plurality of sets of electrical contacts disposed on the base 530 and arranged in a rotationally symmetrical manner and including a plurality of electrical contacts 532, a plurality of electrical lines 540B buried in the base 510 and electrically connecting the plurality of sets of electrical contacts 530 to a plurality of connectors 560, and one or more fixed blocks 580 for retaining the DUT 20A in a recessed portion 550 surrounded by the upper surface 512 of the base 510 and the frame 520.

The configurations of the base 510, the frame 520, the electrical contacts 530, the recessed portion 550 and the plurality of connectors 560 in these embodiments are essentially the same as the configurations of the like components, which are denoted by like reference numerals in the embodiments shown in FIGS. 3 to 7. The details of the like components shown in FIGS. 8 and 9 may thus be found in the discussion of the embodiments shown in FIGS. 3 to 7.

In FIGS. 8 and 9, the electrical lines 540B electrically connect to the plurality of sets of the electrical contacts 530 at positions corresponding to the positions where the connectors 560 are connected. In other words, one of the electrical lines 540B connects to the electrical contacts 532 in the plurality of sets of electrical contacts 530 at positions corresponding to the connectors 560. As a result, the power supply 60 can provide electricity to the DUT 20A from any of the connectors 560, further improving the connection degree of freedom.

In conclusion, the testing fixture 50/50A/50B including the plurality of connectors 560 arranged along the central axis C of the base 510 with consistent angular orientation allows the power supply 60 to be connected to the testing fixture 50/50A/50B in various orientations, which improves the assembly degree of freedom.

One aspect of the present disclosure provides a testing fixture. The testing fixture, for holding a device under test (DUT), includes a base, a frame and a plurality of sets of electrical contacts. The frame extends upward along an outer perimeter of an upper surface of the base. The plurality of sets of electrical contacts are disposed on the base and arranged in a rotationally symmetrical manner. The DUT is received in the recessed portion and a plurality of plated through holes of the DUT are in contact with one of the plurality of sets of the electrical contacts.

One aspect of the present disclosure provides a testing assembly. The testing assembly includes a device under test (DUT) and a testing fixture. The DUT includes a printed circuit board (PCB), at least one electronic component mounted on the PCB, and a plurality of plated through holes penetrating through the PCB. The testing fixture includes a base, a frame, a recessed portion and a plurality of sets of electrical contacts. The frame extends upward along an outer perimeter of an upper surface of the base. The recessed portion is surrounded by the frame and the upper surface of the base. The plurality of sets of electrical contacts are disposed on the base and arranged in a rotationally symmetrical manner. The plurality of sets of the electrical contacts are provided at positions corresponding to the plated through holes. The DUT is received in the recessed portion and the plurality of plated through holes are in contact with one set of the electrical contacts.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods and steps.

What is claimed is:
1. A testing fixture, comprising:
   a base;
   a frame disposed on an upper surface of the base and extending upward along an outer perimeter of the upper surface of the base;
   a plurality of sets of electrical contacts disposed on the upper surface of the base and arranged in a rotationally symmetrical manner, wherein the plurality of sets of electrical contacts electrically connected to a power source to supply electricity;
   "a plurality of connecters disposed at a lateral of the base; and
   a plurality of electrical lines electrically connecting the plurality of sets of the electrical contacts to the plurality of connectors;
   wherein a number of the plurality of connectors is equal to a number of the plurality of sets of electrical contacts, and the plurality of connectors are arranged along a central axis of the base with consistent angular orientation.
2. The testing fixture of claim 1, wherein the frame is symmetric in respect to a central axis of the base.

3. The testing fixture of claim 1, wherein at least one electrical line electrically connects at least one set of the electrical contacts to at least one connector.

4. The testing fixture of claim 1, wherein the electrical lines are buried in the base.

5. The testing fixture of claim 1, wherein the plurality of connectors are aligned with the plurality of sets of electrical contacts when viewed in a plan view.

6. The testing fixture of claim 1, wherein the plurality of connectors are offset from the plurality of sets of electrical contacts when viewed in a plan view.

7. A testing assembly, comprising:
a device under test (DUT) comprising a printed circuit board (PCB), at least one electronic component mounted on the PCB, and a plurality of plated through holes penetrating through the PCB; and
a testing fixture comprising:
a base; a frame disposed on an upper surface of the base and extending upward along the outer perimeter of an upper surface of the base; a recessed portion surrounded by the frame and the upper surface of the base; a plurality of sets of electrical contacts disposed on the upper surface of the base and arranged in a rotationally symmetrical manner, wherein the plurality of sets of the electrical contacts are provided at positions corresponding to the plated through holes, wherein the plurality of sets of electrical contacts electrically connected to a power source to supply electricity to be conducted to the DUT;
a plurality of connecters disposed at a lateral of the base;
and a plurality of electrical lines electrically connecting the plurality of sets of the electrical contacts to the plurality of connectors,
wherein the DUT is received in the recessed portion and the plurality of plated through holes are in contact with a set of the electrical contacts,
wherein a number of the plurality of connectors is equal to a number of the plurality of sets of electrical contacts, and the plurality of connectors are arranged along a central axis of the base with consistent angular orientation.

8. The testing assembly of claim 7, wherein the testing fixture further comprises at least one fixed block disposed in the recessed portion for securing the DUT in the recessed portion.

9. The testing assembly of claim 8, wherein the testing fixture further comprises at least one fastening member locking the fixed block to the base.

10. The testing assembly of claim 7, wherein the testing fixture further comprises at least one fastening member locking the PCB to the base.

11. The testing assembly of claim 7, wherein a top surface of the PCB is coplanar with a top surface of the frame.

12. The testing assembly of claim 7, wherein the frame is symmetric in respect to a central axis of the base.

13. The testing assembly of claim 7, wherein the electrical lines are buried in the base.

* * * * *